(12) United States Patent
Hung et al.

(10) Patent No.: US 12,051,683 B2
(45) Date of Patent: Jul. 30, 2024

(54) SEMICONDUCTOR PACKAGES AND METHODS FOR FORMING THE SAME

(71) Applicant: TAIWAN SEMICONDUCTOR MANUFACTURING COMPANY, LTD., Hsinchu (TW)

(72) Inventors: Han-Tang Hung, Hsinchu (TW); Shin-Yi Yang, New Taipei (TW); Ming-Han Lee, Taipei (TW); Shau-Lin Shue, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 178 days.

(21) Appl. No.: 17/474,461

(22) Filed: Sep. 14, 2021

(65) Prior Publication Data

US 2022/0359483 A1 Nov. 10, 2022

Related U.S. Application Data

(60) Provisional application No. 63/184,955, filed on May 6, 2021.

(51) Int. Cl.
| | |
|---|---|
| *H01L 25/18* | (2023.01) |
| *H01L 21/78* | (2006.01) |
| *H01L 23/00* | (2006.01) |
| *H01L 23/31* | (2006.01) |
| *H01L 23/485* | (2006.01) |
| *H01L 23/58* | (2006.01) |
| *H01L 25/00* | (2006.01) |

(52) U.S. Cl.
CPC ............ *H01L 25/18* (2013.01); *H01L 21/78* (2013.01); *H01L 23/3107* (2013.01); *H01L 23/485* (2013.01); *H01L 23/585* (2013.01); *H01L 24/16* (2013.01); *H01L 25/50* (2013.01); *H01L 2224/16225* (2013.01)

(58) Field of Classification Search
None
See application file for complete search history.

(56) References Cited

U.S. PATENT DOCUMENTS

| | | | |
|---|---|---|---|
| 7,087,452 B2 * | 8/2006 | Joshi | H01L 23/585 |
| | | | 438/460 |
| 8,802,504 B1 | 8/2014 | Hou et al. | |
| 8,803,292 B2 | 8/2014 | Chen et al. | |
| 8,803,316 B2 | 8/2014 | Lin et al. | |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |

(Continued)

*Primary Examiner* — Hung K Vu
(74) *Attorney, Agent, or Firm* — NZ CARR LAW OFFICE

(57) ABSTRACT

Embodiments of the present disclosure provide a semiconductor package comprising a first integrated circuit (IC) die having a first back-end-of-the-line (BEOL) structure, a second integrated circuit die having a second BEOL structure, an integrated BEOL structure having a first side in direct contact with both the first BEOL structure and the second BEOL structure. In some embodiments, a substrate is further disposed at a second side of the integrated BEOL structure to support both the first integrated circuit die and the second integrated circuit die.

20 Claims, 11 Drawing Sheets

(56) References Cited

U.S. PATENT DOCUMENTS

| | | |
|---|---|---|
| 9,443,783 B2 | 9/2016 | Lin et al. |
| 9,496,189 B2 | 11/2016 | Yu et al. |
| 2016/0218082 A1* | 7/2016 | Lee .................... H01L 24/20 |

* cited by examiner

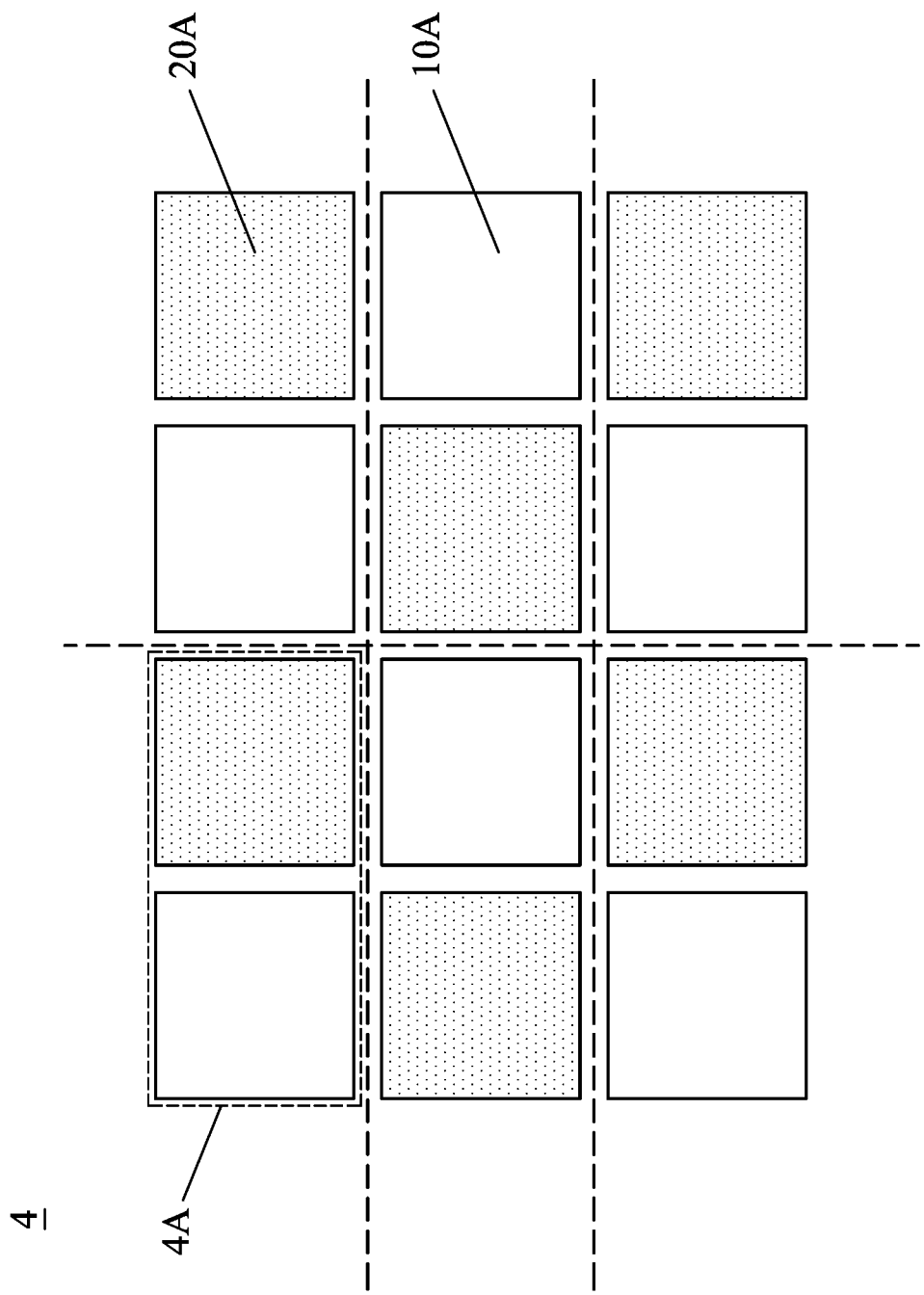

SEMICONDUCTOR PACKAGES AND METHODS FOR FORMING THE SAME

BACKGROUND

The semiconductor industry continues to improve the integration density of various electronic components (e.g., transistors, diodes, resistors, capacitors, etc.) by continual reductions in minimum feature size, which allow more components, hence more functions, to be integrated into a given area, forming integrated circuit dies. Each integrated circuit die may include many input/output pads to communicate with other components to be packaged with the integrated circuit die. Interposers are commonly used to provide input/output among two or more integrated circuit dies in a semiconductor package. However, integration density increases, connecting integrated circuit dies through interposers alone may become challenging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2E schematically demonstrate various stages of forming the integrated circuit semiconductor package according to embodiments of the present disclosure.

DETAILED DESCRIPTION

Figure 1:
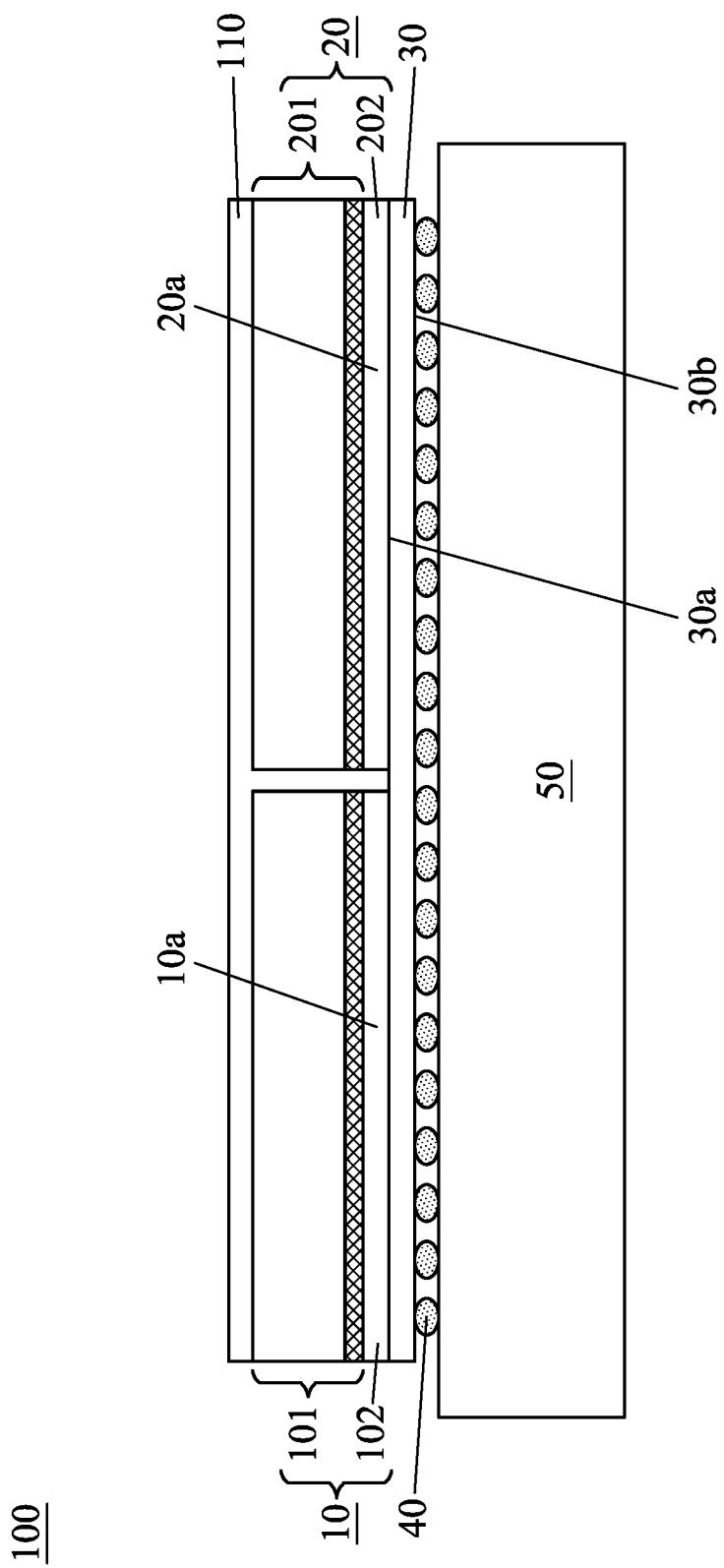
FIG. 1 schematically demonstrates an integrated circuit semiconductor package according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure herein are related to semiconductor packaging and methods of fabrication thereof. Particularly, embodiments of the present disclosure relate to a 2.5D integrated circuit (2.5D IC) packaging, which refers to combining integrated circuit dies in a single package without stacking them into a three-dimensional integrated circuit (3D IC) with through-silicon vias (TSV). In 2.5D IC, integrated circuit dies are placed side by side instead of being stacked together to reduce heat buildup. To support heterogeneous integration of the 2.5D IC, several attempts have been made. For example, in Chip-on-Wafer-on-Substrate (CoWoS), an interposer has been used to support a System-on-Chip (SoC) and a Random-Access-Memory (RAM) or another SoC placed side-by-side with each other and interconnect the SoC and RAM (or another SoC) with external structure through a substrate. Embedded Multi-die Interconnect Bridge (EMIB) including a silicon bridge has also been developed. The EMIB has a size smaller than that of the interposer to bridge the SoC with the RAM (or another SoC). Fabrication of the interposer is very costly and requires formation of through-silicon vias and double-side back-end-of-the-line (BEOL), while EMIB is challenging with respect to ultra-fine-pitch due to EMIB embedding tolerance.

Embodiments of the present disclosure provide a heterogeneous IC including two or more integrated circuit dies, arranged side by side after testing, and then joined together by a common interconnect structure, and methods for forming the heterogeneous IC. The common interconnect structure may be fabricated using BEOL processes.

FIG. 1 schematically illustrates an IC semiconductor package 100 according to some embodiments of the present disclosure. The IC semiconductor package 100 includes a first integrated circuit die 10 and a second integrated circuit die 20 placed side by side, an integrated BEOL structure 30 formed directly on the integrated circuit dies 10 and 20. The integrated BEOL structure 30 functions as the interposer or the silicon bridge in 2.5D integrated circuit technology. Integrated circuit fabrication typically includes two major stages, namely, a Front-End-Of-The-Line (FEOL) stage and a BEOL stage, respectively. In the stage of FEOL, isolated semiconductor devices such as transistors, capacitors, resistors, and other devices are formed on a wafer, such as a semiconductor substrate. In the stage of BEOL, conductive features, such as conductive lines and vias are formed in dielectric material to connected and interconnect the isolated devices such as transistors, capacitors, and resistors. The BEOL stage may include various processing operations such as formation of first metal layer, formation of inter-metal dielectric (IMD) layer(s), formation of vias to connect first metal layer(s) with a second and other metal layers, and formation of passivation layer(s). The process and structure of BEOL will be further discussed with reference to FIG. 2E hereinafter.

In the embodiment as shown in FIG. 1, the first integrated circuit die 10 and the second integrated circuit die 20 are placed side by side with each other and integrated into a 2.5D IC device. In some embodiments, the first integrated circuit die 10 may be an SOC die. The second integrated circuit die 20 may be a RAM die or another SOC die. In some embodiments, the IC semiconductor package may include a device supporting 5th generation mobile (5G) network.

In some embodiments, each of the first integrated circuit die 10 and the second integrated circuit die 20 may have a major surface area in a range between about 1 mm×1 mm and 10 cm×10 cm. For example, each of the first integrated circuit die 10 and the second integrated circuit die 20 may have a major surface area in a range between about 2 mm×2 mm and 10 cm×10 cm. Although the first integrated circuit die 10 and second integrated circuit die 20 appear to have the same height and surface area as shown in FIG. 1, the height and/or size of the first integrated circuit die 10 may be different from the height and/or surface area of the second integrated circuit die 20. A bottom surface 10a, that is, the side formed with an BEOL structure 102, of the first integrated circuit die 10 and a bottom surface 20a, that is, the side formed with a BEOL structure 202, of the second integrated circuit die 20 are levelled with other on the same plane. In other words, the bottom surface 10a and the bottom surface 20a may be substantially coplanar.

With the bottom surfaces 10a, 20a levelled substantially on the same plane, the first integrated circuit die 10 and the second integrated circuit die 20 are bonded using a molding compound 110. The molding compound 110 may include epoxy, polyimide, benzocyclobutene (BCB), polybenzoxazole (PBO) or a combination thereof, with or without filler embedded therein to achieve desired structural and/or thermal property. In some embodiments, the molding compound 110 may include carbon filler or glass filler. In some embodiments, the coefficient of thermal expansion (CTE) of the molding compound 110 may range between about 1 $\mu m \cdot m^{-1} \cdot K^{-1}$ and about 5 $\mu m \cdot m^{-1} \cdot K^{-1}$. In some embodiments, the coefficient of thermal expansion (CTE) of the molding compound 110 may be in a range between about 2.3 $\mu m \cdot m^{-1} \cdot K^{-1}$ and about 2.7 $\mu m \cdot m^{-1} \cdot K^{-1}$. In some embodiments, materials that may withstand the process temperature to up to 500° C. may be selected for forming the molding compound 110.

Instead of a SOC die, the first integrated circuit die 10 may be other logic dies, for example, central processing unit (CPU), application specific IC (ASIC), field programmable gate array (FPGA), microcontroller may also be integrated into the IC product. Similarly, the second integrated circuit die 20 may be other integrated circuit dies, such as a DRAM die, a Wide (input/output) I/O die, an M-RAM die, a R-RAM die, a NAND die, an SRAM die, a memory cube such as a high bandwidth memory (HBM) and hybrid memory cube (HMC).

In the embodiment as shown in FIG. 1, the first integrated circuit die 10 may include a FEOL structure 101 and a BEOL structure 102. The FEOL structure 101 may include a device portion, shown in a hatched region, in which various devices are formed, and a substrate portion. The BEOL structure 102 interconnects the devices formed in the FEOL structure 101 to external devices and/or power supplies. Similarly, the second integrated circuit die 20 may also include a FEOL structure 201 and a BEOL structure 202. Various devices formed in the FEOL structure 201 are connected to external devices and/or power supplies by the BEOL structure 202.

In addition to the BEOL structures 102 and 202 of the first integrated circuit die 10 and the second integrated circuit die 20, respectively, the IC semiconductor package 100 includes an integrated BEOL structure 30 formed under the BEOL structures 102 and 202. In some embodiments, the integrated BEOL structure 30 functions to provide connections to the integrated circuit dies 10, 20, similar to an interposer or a silicon bridge. In some embodiments, an interposer or a silicon bridge is omitted in the IC semiconductor package 100 according to present disclosure.

The integrated BEOL structure 30 is formed to globally cover the BEOL structure 102 and the BEOL structure 202, so as to serve as a common platform to support both the first integrated circuit die 10 and the second integrated circuit die 20. As shown in FIG. 1, a first side 30a of the integrated BEOL structure 30 is in direct contact with both the BEOL structure 102 of the first integrated circuit die 10 and the BEOL structure 202 of the second integrated circuit die 20. The integrated BEOL structure 30 provides interconnection between the first integrated circuit die 10 and the second integrated circuit die 20 and connection with external devices.

The integrated BEOL structure 30 may include one or more IMD layers. In some embodiments, the integrated BEOL structure 30 may include 1 to 10 IMD layers. The IMD layers of the integrated BEOL structure 30 may be formed by suitable BEOL processes, such as single or dual damascene processes. In some embodiments, the integrated BEOL structure 30 may include single damascene structures. The single damascene structures may have a width in a range between about 2 nm to about 1000 nm. The single damascene structures may have an aspect-ratio in a range between about 1 and about 5. In other embodiments, the integrated BEOL structure 30 may include dual damascene structures. The dual damascene structures may have a width in a range between about 2 nm and about 1000 nm. The dual damascene structures may have an aspect-ratio in a range between about 1 and about and an aspect ratio smaller than 10.

Conductive joints 40 are formed in direct contact with a second side 30b of the integrated BEOL structure 30 to establish electrical connection between the integrated BEOL structure 30 and a substrate 50. The substrate 50 then electrically connects the first integrated circuit die 10 and the second integrated circuit die 20 with external devices or systems via the integrated BEOL structure 30. The conductive joints 40 may include SnAgCu (SAC) solder joints, copper (Cu) pillar joints, and other structures with the equivalent functions. The size of the SAC joints ranges from about 1 μm to about 300 μm. The size of the copper pillar joints may range from about 1 μm to about 50 μm.

Figure 2A:
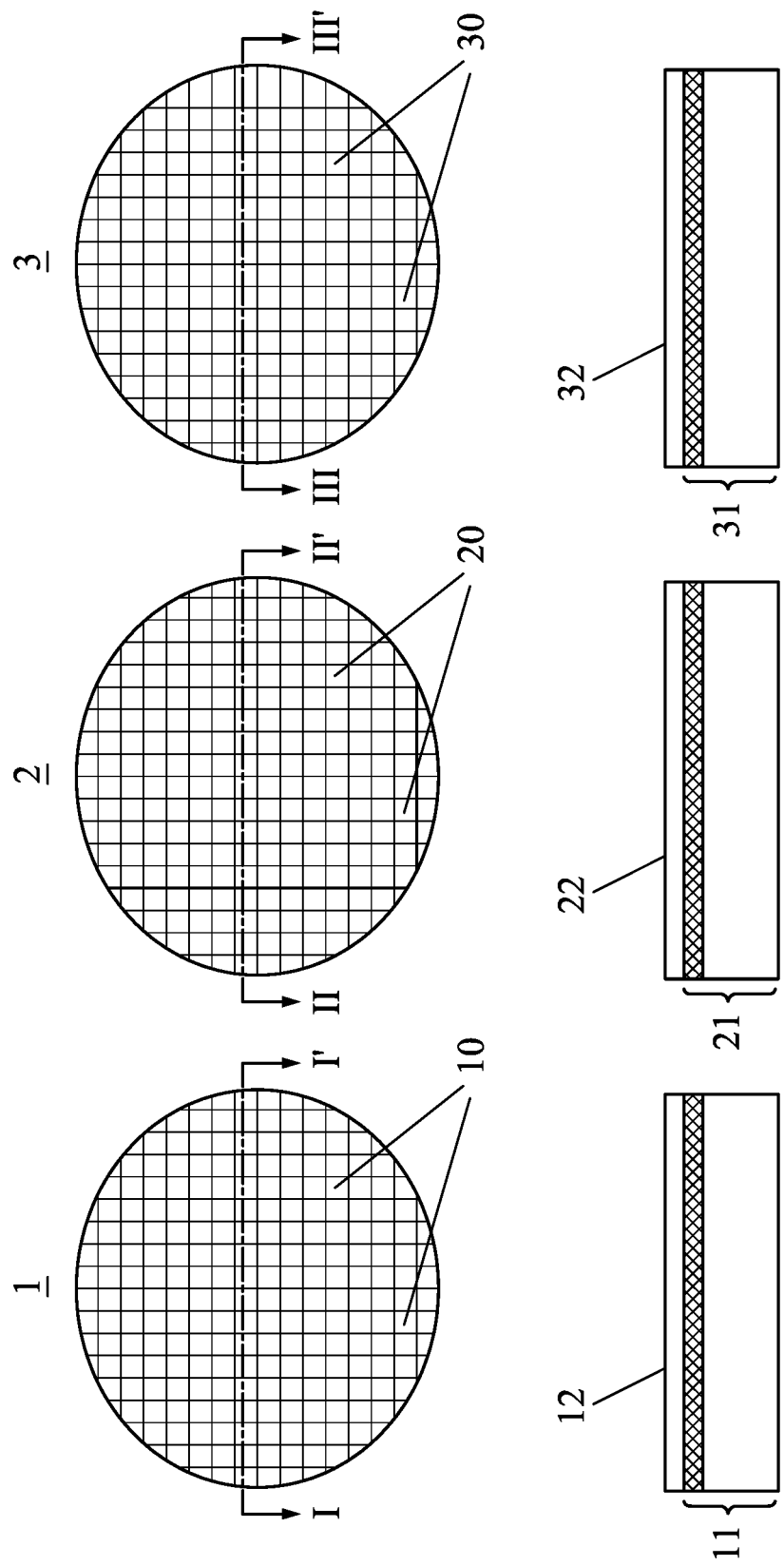

FIGS. 2A to 2E show the process to form a heterogeneous IC structure, for example, the heterogeneous IC semiconductor package 100 as shown in FIG. 1, according to embodiments of the present disclosure. The upper part of FIG. 2A shows the top views of individual semiconductor wafers 1, 2, and 3, and the lower part of FIG. 2A shows the cross-sectional views of the wafers 1, 2, and 3 along the cutting lines I-I, II-II', and III-III', respectively. At least one of the wafers 1, 2, and 3 may include an array of logic integrated circuit dies, while the remaining wafers may include an array of logic dies of the same or different types or memory dies of the same or different types. For example, the first wafer 1 may include an array of first SoC dies such as the first integrated circuit die 10 as shown in FIG. 1. The second wafer 2 may include an array of other SoC dies or RAM dies such as the second integrated circuit die 20 as shown in FIG. 1. The third wafer 3 may include an array of third integrated circuit dies 30. The third integrated circuit die 30 may be a SoC die or a RAM die. As shown in the cross-sectional views, the wafer 1 may include an FEOL structure 11 and a BEOL structure 12 stacked with each other. The wafer 2 may include a FEOL 21 and a BEOL structure 22, and the wafer 3 may include a FEOL structure 31 and a BEOL structure 32.

Each of the wafers 1, 2, and 3 is subject to a dicing process to separate the individual integrated circuit dies 10, 20, and 30. In some embodiments, after the dicing process, a Known-Good-Die (KGD) test is performed on each of the separate integrated circuit dies 10, 20, and 30. In other embodiments, the KGD test may be performed prior to dicing the individual integrated circuit dies 10, 20, and 30. The KGD test is applied to each individual integrated circuit dies 10, 20, and 30 to determine normal functionality, such that any damaged dies or dies with abnormal functionality are prevented from being selected and integrated into a desired end product. This ensures a better yield of the desired end product.

Figure 2B:
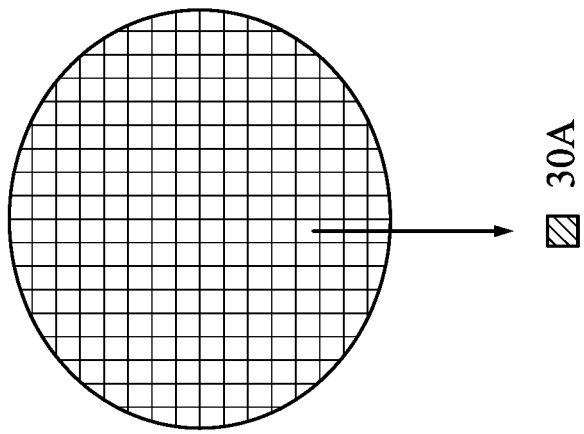
Figure 2B:
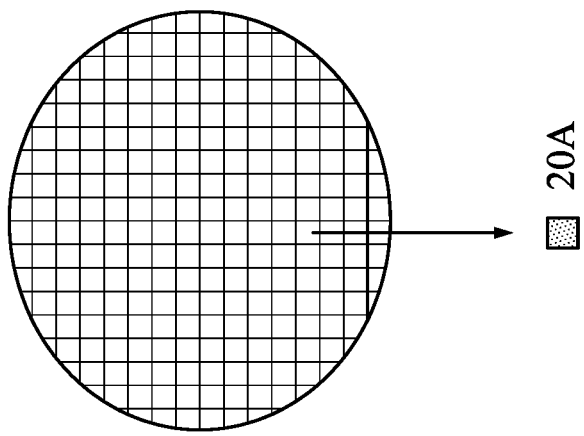
Figure 2B:
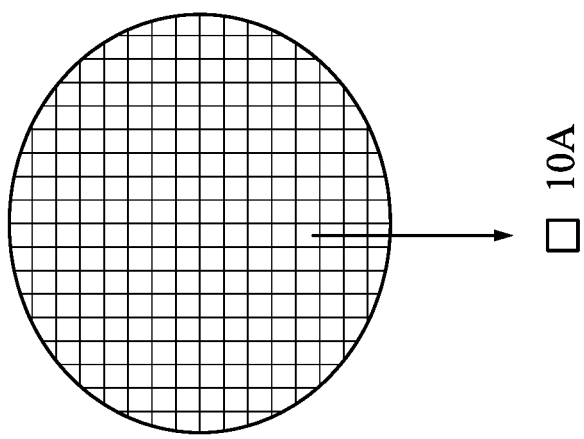
Figure 2C:
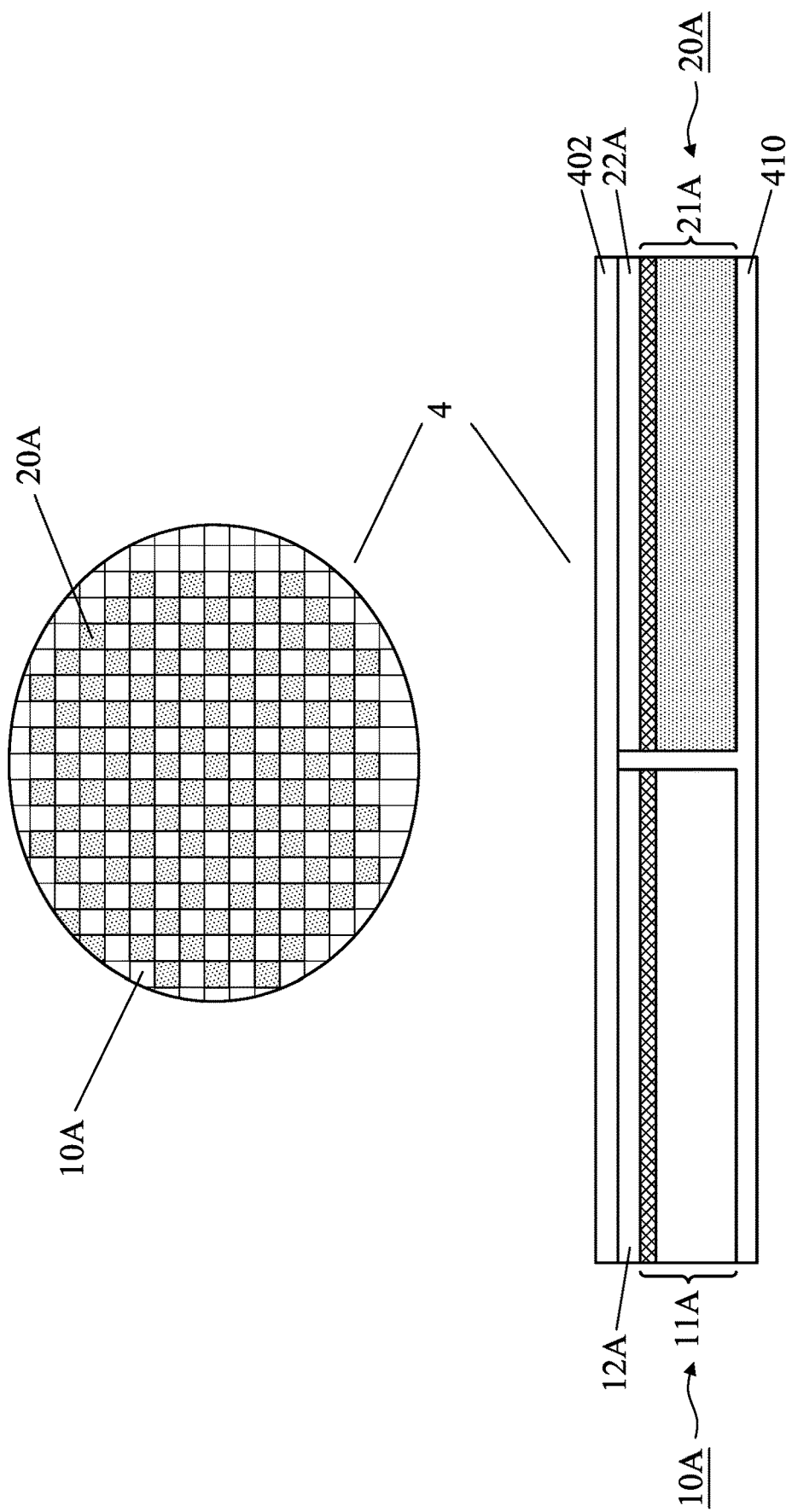

As shown in FIG. 2B, the individual integrated circuit dies 10, 20, and 30 passed the KGD tests, denoted as KGD 10A, KGD 20A, KGD 30 respectively, are selected for further fabrication. The selected KGDs 10A, 20A, and 30A are then reconfigured into a reconfigured wafer. FIG. 2C shows a top view and a cross sectional view of a reconfigured wafer 4 according to some embodiments. The reconfigured wafer 4 is formed by integrating KGDs 10A and KGDs 20A with a molding compound 410. In some embodiments, a carrier wafer, not shown, may be used to enable arrangement of the KGDs 10A and KGDs 20A in the molding compound 410. The carrier wafer may be removed after the molding compound 410 is formed and cured with the KGDs 10A and KGDs 20A arranged thereon. The molding compound 410 may be similar to the molding compound 110 of FIG. 1. The KGDs 10A (presented by the white boxes) and the KGDs 20A (presented by the shaded boxes) are alternately arranged in the reconfigured wafer 4 in a checkerboard pattern, as shown in the top view in the upper part of FIG. 2C. Each of the KGDs 10A includes a FEOL structure 11A and a BEOL structure 12A, and each of the KGDs 20A includes a FEOL structure 21A and a BEOL structure 22A.

An integrated BEOL structure 402 is formed to cover both the BEOL structure 12A of the KGD 10A and the BEOL structure 22A of the KGD 20A. The integrated BEOL structure 402 is in direct contact with the BEOL structures 12A and 22A to provide electrical connection between the KGDs 10A and 20A and external devices. The integrated BEOL structure 402 may be similar to the integrated BEOL structure 202 in FIG. 1.

In FIG. 2D, the reconfigured wafer 4 is diced into individual IC devices 4A along the dash lines. In the embodiment of FIGS. 2A-2E, each of the individual IC devices 4A includes a pair of integrated circuit dies 10A and 20A. These IC devices 4A may be subject to known good die tests again, and then packaged or combined with other devices before packaging.

Figure 2E:
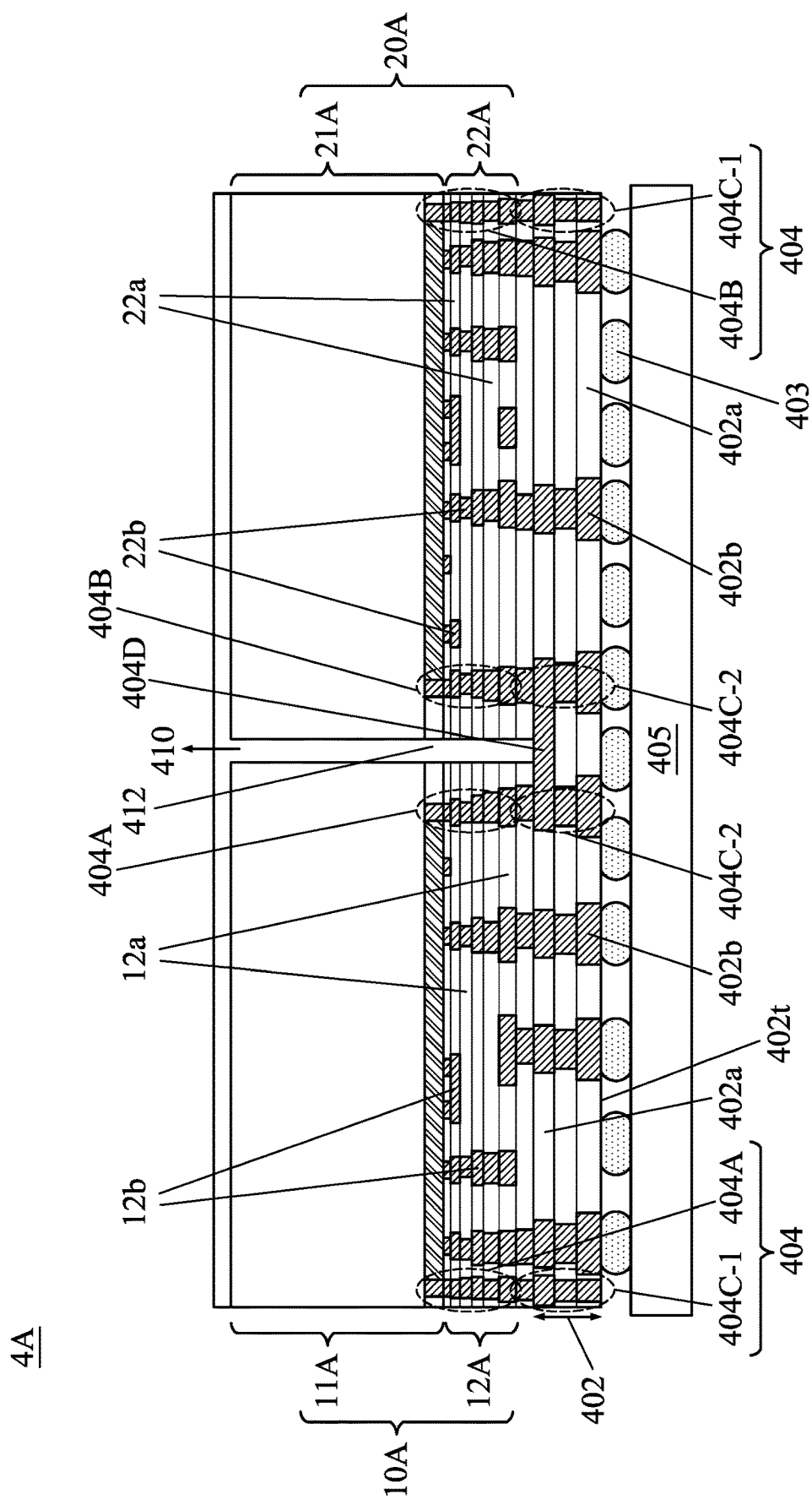

FIG. 2E is a cross sectional view showing the detailed structures of the individual IC device 4A diced from the reconfigured wafer 4. As shown, each of the diced IC devices 4A includes two integrated circuit dies 10A, 20A integrated on the same substrate. The first integrated circuit die may include the KGD 10A. The second integrated circuit die may include the KGD 20A, which may be of the same type or different type of the KGD 10A. The second integrated circuit die may include a memory die such as a RAM or other different of memory dies. The first integrated circuit die 10A includes the FEOL structure 11A and the BEOL structure 12A, and the second integrated circuit die 20A includes the FEOL structure 21A and the BEOL structure 22A. The first integrated circuit die 10A and the second integrated circuit die 20A are bonded with each other by the molding compound 410 and supported by a common BEOL structure, that is, the integrated BEOL structure 402. The integrated BEOL structure 402 is positioned between the first and second dies 10A, 20A and a common substrate 405. The integrated BEOL structure 402 is connected to the substrate 405 via multiple conductive joints 403. The conductive joints 403 are formed to interconnect the integrated circuit dies 10A and 20A to external devices through the substrate 405. Materials for forming the conductive joints 403 and sizes of the joints 403 are similar to those of the conductive joints 40 as shown in FIG. 1.

As discussed above, once various devices are formed in the FEOL stage, processing operations in the stage of BEOL are performed to interconnect between the individual devices with a metallization process. During metallization process, metal wiring between individual devices is deposited, followed by formation of contacts and dielectric structures. The BEOL stage generally begins when the first layer of a conducting metal is deposited on top of the wafer (FEOL structure). A photoresist layer is formed on the metal layer. The photoresist layer is then patterned with a desired layout of the metal wiring. An etching process is performed to remove the unprotected metal layer to obtain a pattern of wiring which connects different components of the integrated circuit die or chip. Most integrated circuit die needs more than one layer of wires to form all necessary connections. In some embodiments, about 5 to 12 metal layers are added in the BEOL process. These metal layers are isolated by dielectric layers to prevent the wires from creating a short circuit with other metal layers. Various metal layers are interconnected by etching holes (vias) formed in the dielectric layer. The integrated BEOL structure 402 may also be formed in similar manner.

In FIG. 2E, the BEOL structure 12A of the KGD die 10A includes multiple dielectric layers 12a and multiple conductive features 12b such as vias formed in the dielectric layers 12a. Similarly, the BEOL structure 22A of the integrated circuit die 20A includes multiple dielectric layers 22a and multiple conductive features 22b in the dielectric layers 22a. The integrated BEOL structure 402 also includes multiple dielectric layers 402a and multiple conductive features 402b formed in the dielectric layers 402a.

The dielectric layers 12a, 22a, 402a in the BEOL structure 12A, the BEOL structure 22A, and the BEOL structure 402 may be formed of dielectric material such as $SiO_x$, $SiO_xC_yH_z$, $SiO_xC_y$, $SiC_x$, $SiN_x$, or related low-k dielectric material, compounds thereof, composites thereof, combinations thereof, or the like. The dielectric material considered to have a low-k value may include a k value smaller than the k value of silicon dioxide. The dielectric layers 12a, 22a, 402a may be deposited, patterned, and filled with conductive materials layer by layer. The conductive features 12b, 22b, 402b in the BEOL structure 12A, BEOL structure 22A, and the BEOL structure 402 may be made of copper (Cu), cobalt (Co), aluminum (Al), Ruthenium (Ru), Iridium (Ir), platinum (Pt), graphene, carbon nanotube (CNT), other metals, or alloys thereof. The process for forming the conductive features 12b, 22b, 402b may include physical vapor deposition (PVD), PVD reflow, atomic layer deposition (ALD), chemical vapor deposition (CVD), plasma-enhanced atomic layer deposition (PEALD), plasma-enhanced chemical vapor deposition (PECVD), electrochemical plating (ECP), or electroless deposition (ELD). A planarization process such as chemical mechanical polishing (CMP) is performed after the dielectric layers are formed.

In some embodiments of FIGS. 2A-2E, the dielectric layers 12a and 22a closest to the integrated BEOL structure 402 are merged with each other to provide insulation or isolation across the gap between the integrated circuit dies 10A and 20A. The conductive features 402b in the bottom-most dielectric layer 402a are in contact with the conductive joints 403 to provide connection from the integrated circuit dies 10A and 20A to external devices through the conductive features (not shown) formed in the substrate 405.

The IC device 4A as shown in FIG. 2E further includes a guard ring (seal ring) structure 404 extending from the device portion of the FEOL structures 11A and 21A, through the BEOL structures 12A, 22A, and 402, towards an outer side 402t of the integrated BEOL structure 402 where the conductive joints 403 are formed. As will be discussed in more detail below, the guard ring structure 404 may be fabricated layer-by-layer in the same process with the conductive features 12b, 22b, 402b in the dielectric layers 12a, 22a, 402a. The guard ring structure 404 is a protective part at the outer edge or perimeter of the internal circuit region. The guard ring structure 404 may function as a barrier between the conductive features 12b, 22b, 402b in the BEOL structures 12A, 22A, and 402 and the exterior environment, such as moisture.

Various guard ring designs may be used to achieve particular guard ring placement and guard ring effectiveness. In the embodiment as shown in FIG. 2E, the guard ring structure 404 includes a first guard ring 404A which includes a plurality of conductive features 402b formed in different dielectric layers 12a and connected together to form the first guard ring 404A. The first guard ring 404A extends along a perimeter of the first integrated circuit die 10 to encircle the conductive features 12b of the BEOL structure 12A therein. The guard ring structure 404 also includes a second guard ring 404B which includes conductive features 402b formed in different dielectric layers 22a and connected together to form the second guard ring 404B. The second guard ring 404B extends along a perimeter of the second integrated circuit die 20 to encircle the conductive features 22b of the BEOL structures 22A therein. The guard ring structure 404 further includes a third guard ring 404C in the integrated BEOL structure 402 to encircle the conductive features 402b of the integrated BEOL structure 402 therein. The guard ring 404C include a perimeter portion 404C-1 aligned and overlapped with external portions of the first guard ring 404A and the second guard ring 404B, and an inner portion 404C-2 aligned and overlapped with the internal portions of the first guard ring 404A and the second guard ring 404B.

The third guard ring 404C also includes a bridging portion 404D extending between internal portions of the first guard ring 404A and the second guard ring 404B to bridge a gap 412 (filled with molding compound 410) between the proximal sides of the integrated circuit die 10A and the integrated circuit die 20A. In some embodiments, the bridging portion 404D may be a conductive plate formed in the dielectric layer 402a in the integrated BEOL structure 402. The conductive plate connects the conductive features 402b between the inner portions 404C-2 of the third guard ring 404C. In some embodiment, the bridging portion 404D is formed in the dielectric layer 402a closest to the BEOL structure 12A and the BEOL structure 22A. In some embodiments, additional ring structure may be formed in the dielectric layers 402a below the bridging portion 404D to provide structure symmetry. The structure and placement of the guard ring structure 404 ultimately enhance the effectiveness of electric isolation of circuit functions. The IC device 4A as shown in FIG. 2E is further subjected to post-fab process, including IC packaging and final device testing.

Figure 3A:
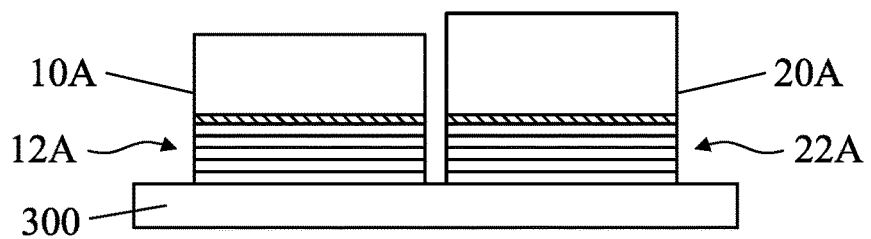
FIGS. 3A-3D schematically demonstrate various stage of forming the BEOL structure of the integrated circuit semiconductor package as shown in FIGS. 2A-2E.
Figure 3B:
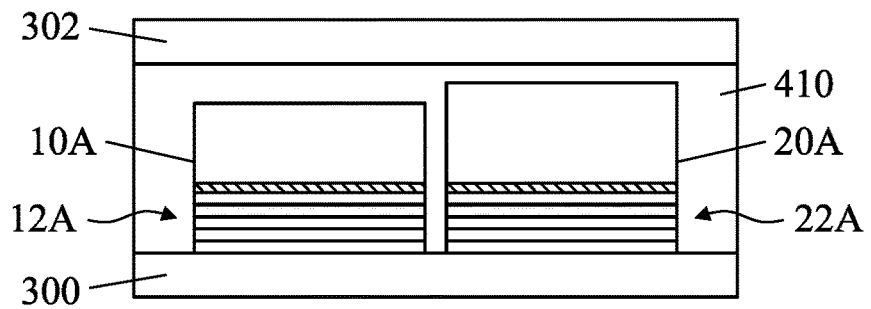
Figure 3C:
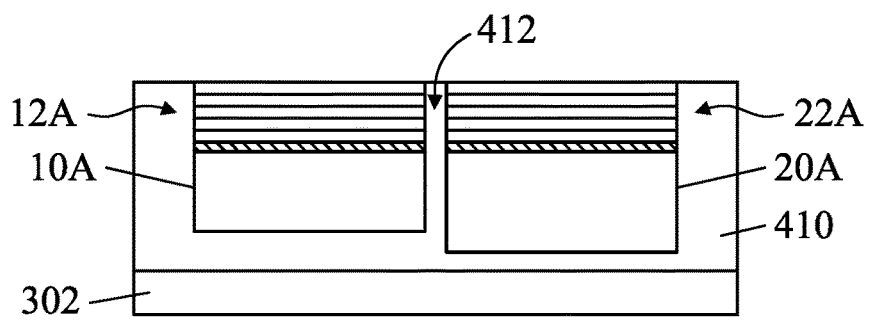
Figure 3D:
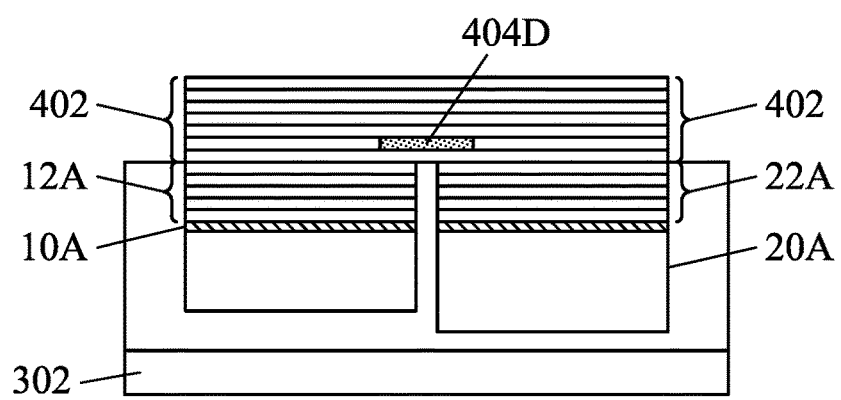

FIGS. 3A to 3D are cross-sectional views of an integrated circuit semiconductor package showing the processes for forming the integrated BEOL structure 402 as shown in FIG. 2E. In FIG. 3A, the reconfigured integrated circuit dies 10A and 20A are placed side by side on a carrier wafer 300. Although FIGS. 3A to 3D show the integrated circuit dies 10A and 20A with different heights, the processes may also be applied to the integrated circuit dies with the same height as shown in FIG. 2E. In addition, more than two integrated circuit dies may be packaged in the integrated circuit semiconductor package. The integrated circuit dies 10A and 20A are bonded to each other on the carrier wafer 300 with a molding compound 410, and a substrate 302 is formed on the molding compound 410 as shown in FIG. 3B. The bonded integrated circuit dies 10A and 20A are then turned upside down such that the BEOL structures 12A and 22A are on top, and the substrate 302 is at the bottom. The carrier wafer 300 is then removed as shown in FIG. 3C. The integrated BEOL structure 402 is then formed on both the BEOL structure 12A of the integrated circuit die 10A and the BEOL structure 22A of the of the integrated circuit die 20A, as shown in FIG. 3D. The guard ring structure and the conductive features formed in the BEOL structures can be referred to FIG. 2E.

Figure 4:
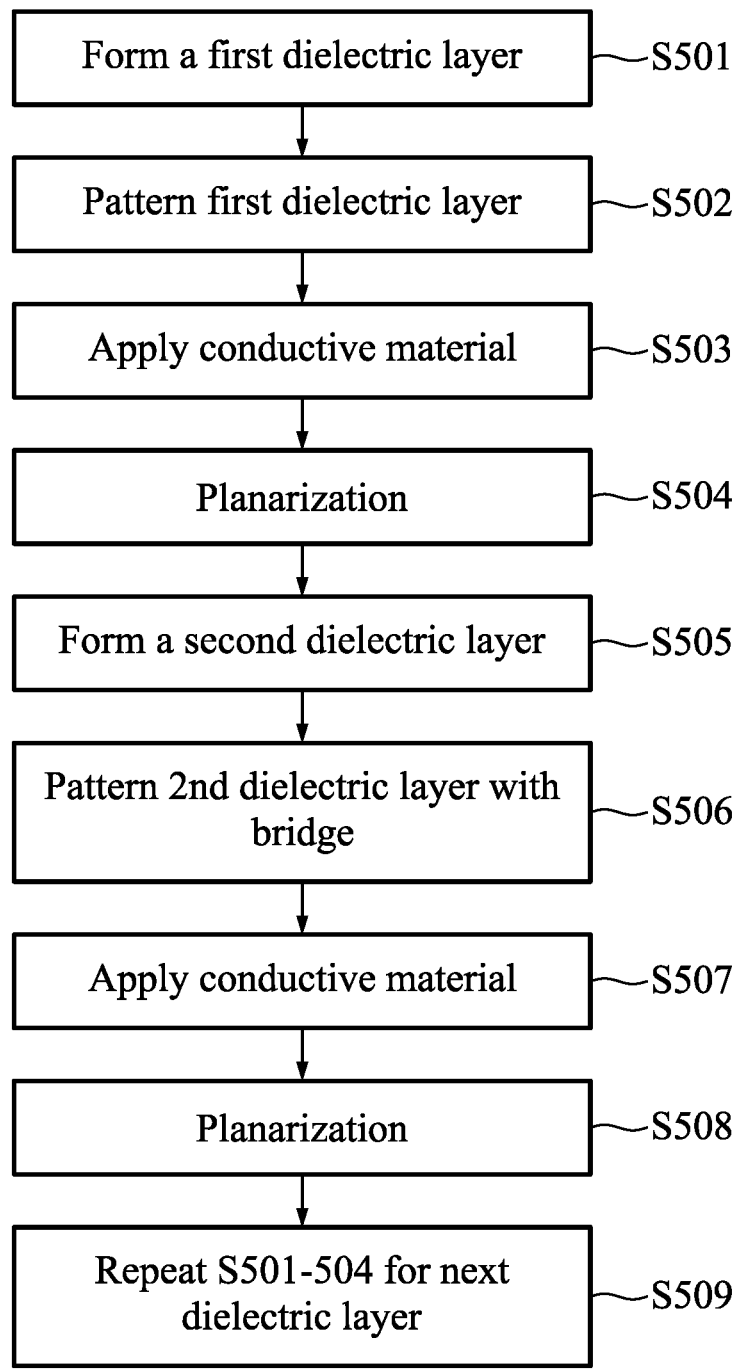
FIG. 4 is a flow chart showing a method of fabricating a BEOL structure of an integrated circuit semiconductor package.

FIG. 4 is a flow chart showing the step of forming the integrated BEOL structure 402 with reference to FIGS. 2E and 3D. In step S501, a first dielectric layer 402a is formed on the BEOL structures 12A and 22A. In step S502, the first dielectric layer 402a is patterned with holes aligned or overlapped with the guard rings 404A and 404B and at least a portion of the conductive features 12b and 22b of the BEOL structures 12A and 22A. Conductive materials are then applied to fill the holes to form a portion of the guard rings 404C and conductive features 402b in step S503, and a planarization process is applied to the first dielectric layer 402a in S504. In step S505, a second dielectric layer 402a is formed on the first dielectric layer 402a. In step S506, the second dielectric layer 402a is patterned with holes aligned or overlapped with the guard rings 404C and at least a portion of the conductive features 402b in the first dielectric layer 402a. The patterned second dielectric layer 402a includes a hole that extend across the gap 412 between the first integrated circuit die 10A and the 20A. Therefore, after applying conductive material to fill the holes in step S506, a bridging portion 404D extending across the gap 412 is formed as shown in FIGS. 2E and 3D. The second planarization process is then applied to the second dielectric layer 402a. The step S509 repeats steps S501 to 504 until a desired number of dielectric layers with the guard rings 404C and conductive features 402b are formed.

Figure 5:
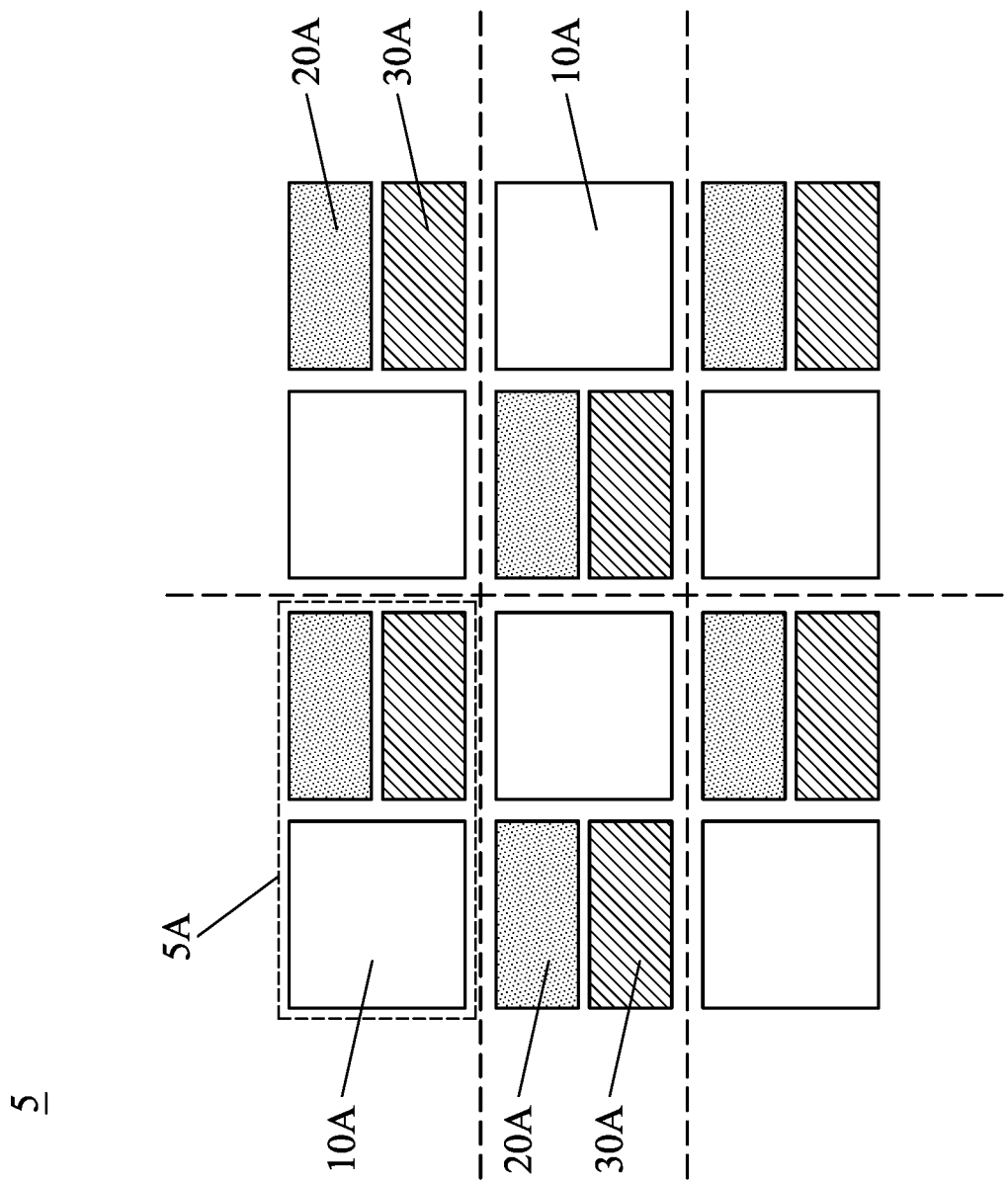
FIGS. 5 and 6 schematically demonstrate integrated circuits with different combination of integration circuit dies according to embodiments of the present disclosure.

FIG. 5 shows a partial top view of a reconfigured wafer 5 in accordance with some embodiments. The reconfigured wafer 5 includes an array of IC devices 5A each being integrated with three integrated circuit dies of different dimensions. Each of the IC devices 5A may include one KGD 10A, one KGD 20A, and one KGD 30A as shown in FIG. 2B. That is, one of the three KGDs, 10A, 20A, 30A may be an SoC die, while each of the remaining two KGDs may be either a SoC die or a RAM die. In the example as shown in FIG. 3, the size of the integrated circuit die 10A is larger than those of the integrated circuit dies 20A and 30A. In real practices, the size of the integrated circuit dies 10A, 20A, and 30A may vary. The position of the integrated circuit dies 10A, 20A, and 30A may also vary. Each of the integrated circuit dies 10A, 20A, and 30A has been subject to known good die test to ensure the normal functionality of IC devices. The integrated circuit dies 10A, 20A, and 30A are bonded together with a molding compound similar to the molding compound 110 as shown in FIG. 1. Each integrated circuit dies 10A, 20A, and 30A includes an FEOL structure and a BEOL structure. An integrated BEOL structure is formed as a common support of the integrated circuit dies 10A, 20A, and 30A. The height of the integrated circuit dies 10A, 20A, and 30A may be the same or different from each other. When the integrated circuit dies 10A, 20A, and 30A are different in height, one side of the integrated circuit dies 10A, 20A, and 30A are leveled and supported by the integrated BEOL structure, while the other side of the integrated circuit dies 10A, 20A, and 30A may extend at different levels. The integrated BEOL structure are bonded or connected to a common substrate with conductive joints such as those conductive joints 40 as shown in FIG. 1. Further in FIG. 5, the integrated circuit die 10A and the pair of integrated circuit dies 20A and 30A are alternately arranged. Likewise, the reconfigured wafer 5 is diced into separate IC devices 5A, which are then packaged individually.

Figure 6:
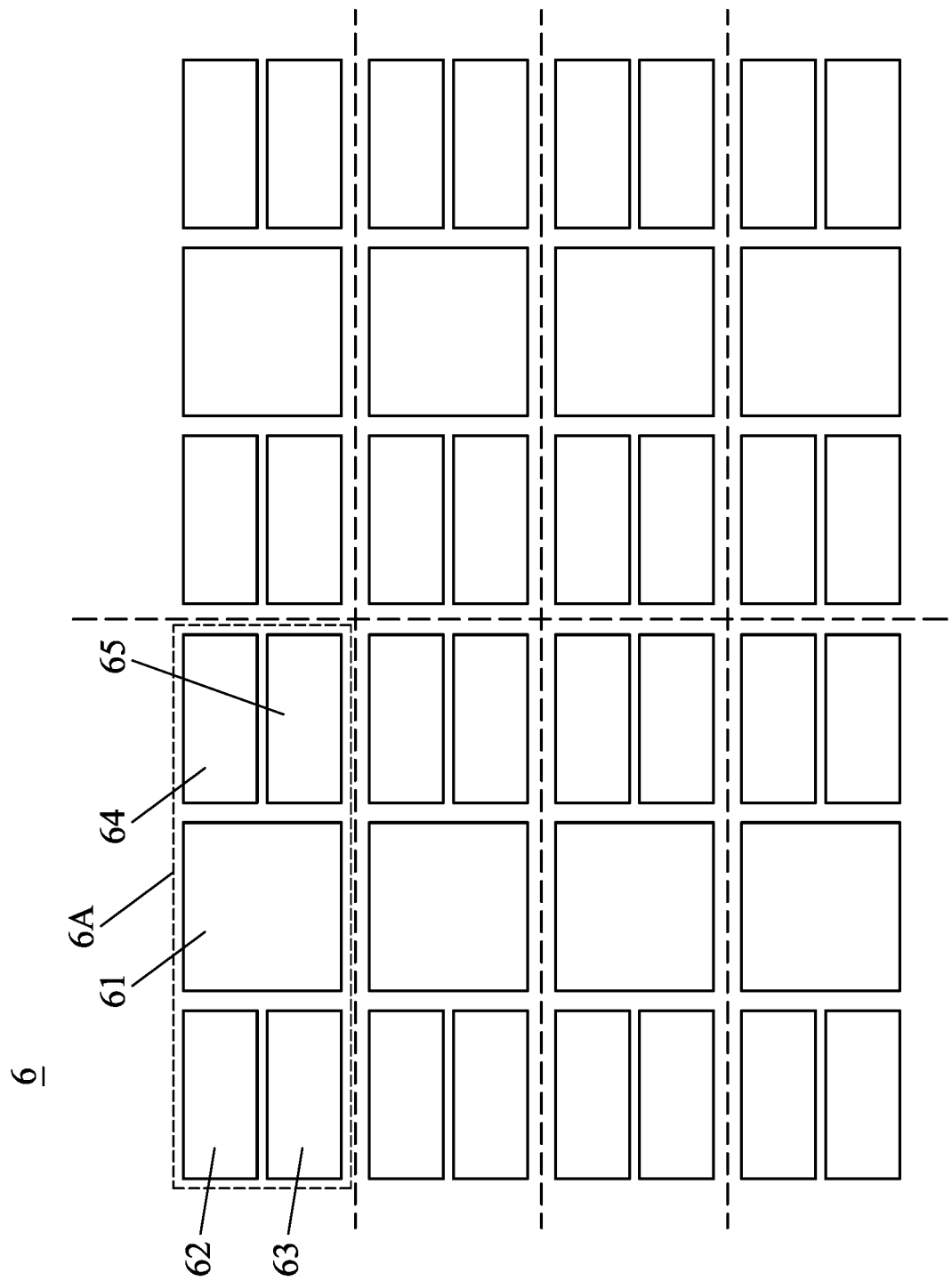

FIG. 6 shows a partial top view of a reconfigured wafer 6 according to another embodiment. The wafer 6 includes an array of IC devices 6A. Each of the IC devices 6A includes five integrated circuit dies 61, 62, 63, 64, and 65 integrated on a common substrate. The first integrated circuit die 61 may be a SoC die, such as the first integrated circuit die 10A as shown in FIGS. 2A-2E. Each of the remaining integrated circuit dies 62, 63, 64, and 65 may include another SoC of the same or different type of the first integrated circuit die 10A, or a memory die such as the second integrated circuit die 20A as shown in FIG. 2A. The integrated circuit dies 61 to 65 are bonded together with a molding compound similar to the molding compound 110 as shown in FIG. 1. Each integrated circuit dies 61 to 65 includes an FEOL structure and a BEOL structure. An integrated BEOL structure is formed as a common support of the integrated circuit dies 61 to 65. The height of the integrated circuit dies 61 to 65 may be the same or different from each other. When integrated circuit dies 61 to 65 are not the same in height, the integrated circuit dies 61 to 65 have first sides leveled with each other and supported by the integrated BEOL structure, while the other sides of the integrated circuit dies 61 to 65 may extend at different levels. The integrated BEOL structure are bonded or connected to the common substrate with conductive joints such as those conductive joints 40 as shown in FIG. 1. Similar to the reconfigured wafer 5, the reconfigured wafer 6 is diced into separate IC devices 6A, which are then packaged individually.

It should be noted that more or less integrated circuit dies may be arranged in each of the IC devices 6A in the reconfigured wafer 6 according to the circuit design. In some embodiments, the number of the integrated circuit dies combined in the IC device 6A in the reconfigured wafer 6 may be between 2 and 20.

Figure 7:
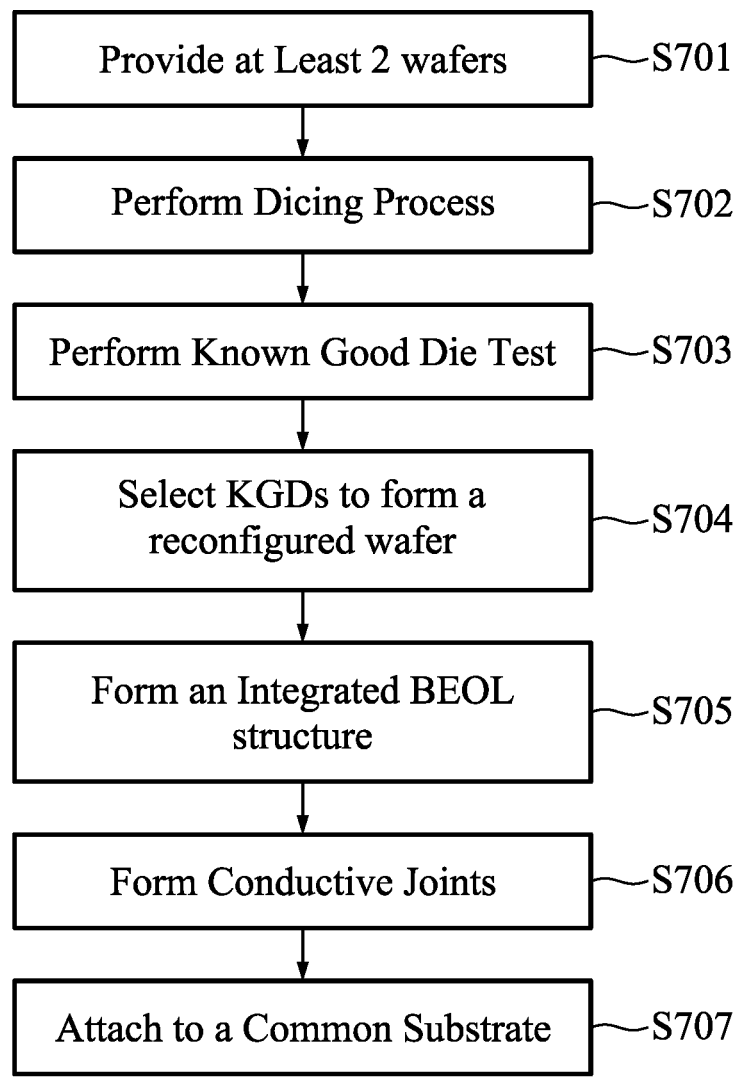
FIG. 7 is a flow chart showing a method of fabricating an integrated circuit semiconductor package according to embodiments of the present disclosure.

FIG. 7 is a flow chart showing the process of a method 700 of fabricating a 2.5D IC according to embodiments of the present disclosure. The 2.5D IC may be a heterogeneous IC device as shown in FIGS. 2E, 3, and 4. To fabricate the 2.5D IC, at least two wafers are provided in operation S701. Each of the wafers includes an array of integrated circuit dies fabricated therein and thereon, such as the integrated circuit dies 10, 20, 30 of the wafers 1, 2, 3 in FIG. 2A. The integrated circuit dies of the first wafer may be the same or different from the integrated circuit dies of the second wafer. In some embodiments, one of the wafers includes an array of SoCs, while the other wafer may include an array of SoCs or RAMs.

In operation S702, a dicing process is performed on each of the wafers to separate the individual integrated circuit dies from each other. In operation S703, a known good die test is performed on each individual integrated circuit dies resulting in KGDs, such as shown in FIG. 2B. In some embodiments, operation S703 may be performed prior to operation S702.

In operation S704, the integrated circuit dies with normal functionality are selected to form a reconfigured wafer, such as the wafer 4 in FIG. 2C. The KGDs from the first wafer and the KGD from the second wafer are alternately arranged along each of multiple rows and each of multiple columns on the reconfigured wafer. The KGDs from the first wafer are bonded to the KGDs from the second wafer using a molding compound. Each of the KGDs from the first and second wafer includes various devices interconnected by a BEOL structure formed in the corresponding KGD. After operation S704, the topmost IMD layer in the KGDs are levelled for subsequent fabrication.

In operation S705, an integrated BEOL structure is formed over the BEOL structures of the KGDs. The integrated BEOL structure, such as the integrated BEOL structure 30 in FIG. 1 and the integrated BEOL structure 402 in FIG. 2C, serves as a common support to the KGDs from the at least two wafers. The integrated BEOL structure is formed with one side in direct contact with the BEOL structure of the integrated circuit dies from the first and second wafers. The integrated BEOL structure also serves as an interconnection layer to connect between each pair of the KGDs from the at least two wafers. The integrated BEOL structure may be formed by BEOL processes, for example by a damascene process. One or more dielectric layer may be formed and patterned to form trench and/or via openings. The trench and/or via openings may be single damascene structures or dual damascene structures formed by a single or a dual damascene process. In some embodiments, the trench and/or via openings are single damascene structures having an opening in a range between about 2 nm to about 1000 nm, and an aspect-ratio in a range between about 1 and about 5. In some embodiments, the trench and/or via openings are dual damascene structures having an opening in a range between about 2 nm to about 1000 nm, and an aspect-ratio in a range between about 1 and about 10. The trench and/or via openings are then filled by a suitable deposition, such as PVD, PVD reflow, ALD, CVD, PEALD, PECVD, ECP, or ELD, and followed by CMP for planarization to form conductive features therein. In some embodiments, the conductive features in the integrated BEOL structure may include Cu, Co, Al, W, Ru, Ir, Pt, graphene, CNT or alloys thereof.

The reconfigured wafer may be further subject to dicing process and other post fab process such as packaging once individual IC devices are separated. In operation S706, multiple conductive joints, such as the conductive joints 40 in FIG. 1 and the conductive joints 403 in FIG. 2E, are formed on the other side of the integrated BEOL structure. In operation S707, a common substrate is provided to connect the integrated BEOL structure via the conductive joints.

Embodiments of the present disclosure provides an integrated circuit which combines integrated circuit dies in a single package without stacking them into a three-dimensional integrated circuit (3D IC) that requires through-silicon vias (TSV). The integrated circuit dies may be selected from those with the same or different structures and functionality. The integrated circuit are placed side by side and connected by an integrated BEOL structure, which is incorporated to in route the integrated circuit dies in a relative low cost. By using the integrated BEOL structure, embodiments of the present disclosure enable a side by side die heterogenous integration in an IC semiconductor package without using interposers or embedded bridges, therefore, achieving a lower power consumption and/or a higher bandwidth in the integrated circuit. Embodiments of the present disclosure also allows KGD testing prior to integration, thus, improving manufacturing yield. Embodiments of the present disclosure using BEOL processes in the integrating and packaging process, thus, easy to follow and capable of being incorporated with other 3D IC packaging technologies.

Some embodiments of the present disclosure provide an integrated circuit (IC) semiconductor package comprising a first integrated circuit (IC) die having a first back-end-of-the-line (BEOL) structure, a second integrated circuit die having a second BEOL structure, a integrated BEOL structure having a first side in direct contact with both the first BEOL structure and the second BEOL structure, and a substrate disposed at a second side of the integrated BEOL structure to support both the first integrated circuit die and the second integrated circuit die.

Some embodiments of the present disclosure provide an IC semiconductor package comprising two or more integrated circuit dies placed side by side with each other and a plurality of dielectric layers having one side in direct contact with the two or more integrated circuits. Each of the two or more integrated circuit dies includes a first guard ring structure extending along a perimeter thereof. The plurality of dielectric layers includes a second guard ring structure extending from the first guard ring structure through the plurality of dielectric layers. The second guard ring structure includes a bridge portion in one of the plurality of dielectric layers. The bridge portion extends across any immediately adjacent two of the two or more integrated circuit dies.

Some embodiments of the present disclosure provide a method of manufacturing an IC device. The method comprises the following operations. At least a first wafer and a second wafer are provided. The first wafer includes an array of first integrated circuit dies. The second wafer includes an array of second integrated circuit dies. The first and second wafers are diced into a plurality of individual first and second integrated circuit dies, respectively. The individual first integrated circuit dies and the individual second integrated circuit dies are bonded together. An integrated back-end-of-the-Line (BEOL) structure is formed with a first side in direct contact with the first and second integrated circuit dies. A plurality of conductive joints is formed at a second side of the of the integrated BEOL structure. The integrated BEOL structure is connected with a substrate via the conductive joints.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. An integrated circuit (IC) semiconductor package, comprising:
    a first integrated circuit (IC) die having a first back-end-of-the-line (BEOL) structure and a first guard ring disposed to encircle conductive features of the first BEOL;
    a second integrated circuit die having a second BEOL structure and a second guard ring disposed to encircle conductive features of the second BEOL; and
    an integrated BEOL structure having a first side in direct contact with the first BEOL structure and the second BEOL structure, the integrated BEOL structure comprising a third guard ring disposed to encircle conductive features of the integrated BEOL structure,
    wherein a perimeter portion of the third guard ring is aligned with a portion of the first guard ring.

2. The semiconductor package of claim 1, wherein the first integrated circuit die includes a system-on-chip (SoC), and the second integrated circuit die includes a SoC or a random access memory (RAM).

3. The semiconductor package of claim 1, further comprising a molding compound, wherein the first integrated circuit die and the second integrated circuit die are bonded together by the molding compound.

4. The semiconductor package of claim 3, wherein molding compound has a coefficient of thermal expansion (CTE) ranging from about 1 $\mu m \cdot m^{-1} \cdot K^{-1}$ to about 5 $\mu m \cdot m^{-1} \cdot K^{-1}$.

5. The semiconductor package of claim 4, wherein the molding compound is made of a material capable of withstanding process temperature up to 500° C.

6. The semiconductor package of claim 1, further comprising a third integrated circuit die bonded to the first integrated circuit die and the second integrated circuit die, and in direct contact with the integrated BEOL structure.

7. The semiconductor package of claim 1, further comprising a substrate disposed at a second side of the integrated BEOL structure to support both the first integrated circuit die and the second integrated circuit die.

8. The semiconductor package of claim 7, further comprising a plurality of conductive joints connecting the integrated BEOL structure and the substrate.

9. The semiconductor package of claim 8, wherein the conductive joints comprise copper (Cu) pillar joints or SnAgCu (SAC) solder balls.

10. The semiconductor package of claim 8, wherein the first integrated circuit die has a height different from a height of the second integrated circuit die.

11. The semiconductor package of claim 1, wherein the integrated BEOL structure includes a plurality of dielectric layers having the conductive features formed therein.

12. The semiconductor package of claim 1, wherein the first guard ring extends along a perimeter of the first integrated circuit die and the second guard ring extends along a perimeter of the second integrated circuit die.

13. The semiconductor package of claim 1, wherein the perimeter portion is further aligned with a portion of second guard ring.

14. An integrated circuit (IC) semiconductor package comprising:
    two or more integrated circuit dies bonded side by side with each other, each having a first guard ring structure disposed around a perimeter thereof; and a plurality of dielectric layers with one side in direct contact with the two or more integrated circuit dies, comprising a second guard ring structure extending from the first guard ring structure of each of the two or more integrated circuit dies through the plurality of dielectric layers, wherein a perimeter portion of the second guard ring is aligned with a portion of the first guard ring of the two or more integrated circuit dies, and wherein the second guard ring structure includes a bridge portion in one of the plurality of dielectric layers, the bridge portion extending across any immediately adjacent two of the two or more integrated circuit dies.

15. The semiconductor package of claim 14, wherein the two or more integrated circuit dies include at least one system-on-chip (SoC) die.

16. The semiconductor package of claim 14, further comprising a molding compound bonding the two or more integrated circuit dies.

17. The semiconductor package of claim 14, wherein inner portions of the second guard ring are connected by a bridge portion, and the bridge portion is in further contact with a portion of the first guard ring of the two or more integrated circuit dies.

18. An integrated circuit (IC) semiconductor package, comprising:
  a first integrated circuit (IC) die having a first back-end-of-the-line (BEOL) structure, wherein the first BEOL structure has a first guard ring extends along a perimeter of the first IC die to encircle conductive features of the first BEOL structure;
  a second integrated circuit die having a second BEOL structure, wherein the second BEOL structure has a second guard ring extends along a perimeter of the second IC die to encircle conductive features of the second BEOL structure;
  an integrated BEOL structure having a first side in direct contact with the first BEOL structure and the second BEOL structure, wherein the integrated BEOL structure has a third guard ring extended to encircle conductive features of the integrated BEOL structure, and the third guard ring comprises:
    a perimeter portion aligned with external portions of the first and second guard rings; and
    an inner portion aligned with internal portions of the first and second guard rings; and
  a molding compound separating the first IC die and the second IC die, wherein the molding compound is in contact with the first BEOL structure, the second BEOL structure, and the integrated BEOL structure.

19. The IC semiconductor package of claim 18, wherein each first and second guard ring comprises a plurality of conductive features connected together in different dielectric layers.

20. The IC semiconductor package of claim 19, wherein the third guard ring has a bridging portion extending between the first guard ring and the second guard ring, and the bridging portion is in contact with the molding compound.

* * * * *